United States Patent [19]

Yuhara et al.

[11] 4,427,515

[45] Jan. 24, 1984

[54] SURFACE ACOUSTIC WAVE DEVICE AND METHOD FOR MANUFACTURING THE SAME

[75] Inventors: Akitsuna Yuhara, Yokohama; Shinya Iida, Tama; Hideo Abe, Yokosuka; Kiyoharu Kishimoto, Yokohama; Katashi Hazama, Zushi, all of Japan

[73] Assignee: Hitachi, Ltd., Tokyo, Japan

[21] Appl. No.: 256,960

[22] Filed: Apr. 23, 1981

[30] Foreign Application Priority Data

Apr. 23, 1980 [JP] Japan .................................. 55-52965

[51] Int. Cl.³ .............................................. C23C 15/00
[52] U.S. Cl. ................................. 204/192 E; 427/100
[58] Field of Search ...................... 427/100; 204/192 E

[56] References Cited

U.S. PATENT DOCUMENTS 3,696,479 10/1972 Dias ...................................... 427/100

*Primary Examiner*—Arthur P. Demers
*Attorney, Agent, or Firm*—Antonelli, Terry & Wands

[57] ABSTRACT

A surface acoustic wave device, a method for manufacturing the same and a manufacturing equipment therefor are disclosed. In the surface acoustic wave device having functional elements such as input and output interdigital electrodes of Al, Al-Si alloy or Al-Cu-Si alloy thin film strips and a grating type reflector, arranged on a piezoelectric substrate and any other bus conductors arranged on the same substrate, at least a portion of the functional elements and the bus conductors having a high frequency metal strip having a line width of no more than 2 μm, at least the metal strip having the width of no more than 2 μm has a film thickness of no less than 0.25 μm at least a portion thereof but no more than an upper limit of an effective film thickness determined by a required characteristic of the surface acoustic wave device, whereby a transfer characteristic of the surface acoustic wave device is compensated and controlled, for example, a reflection efficiency of a grating type reflector is improved or a loss due to a D.C. resistance of the input and output electrodes is reduced.

9 Claims, 9 Drawing Figures

U.S. Patent  Jan. 24, 1984  Sheet 1 of 3  4,427,515
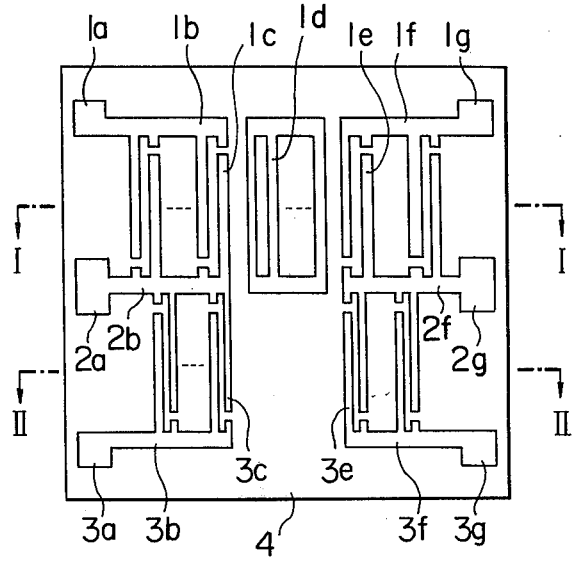
FIG. 1
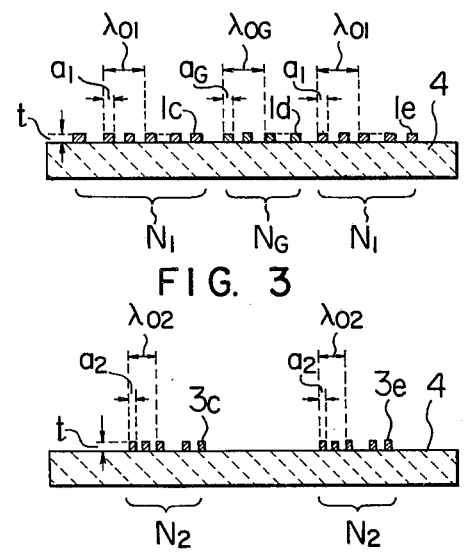
FIG. 2
FIG. 3
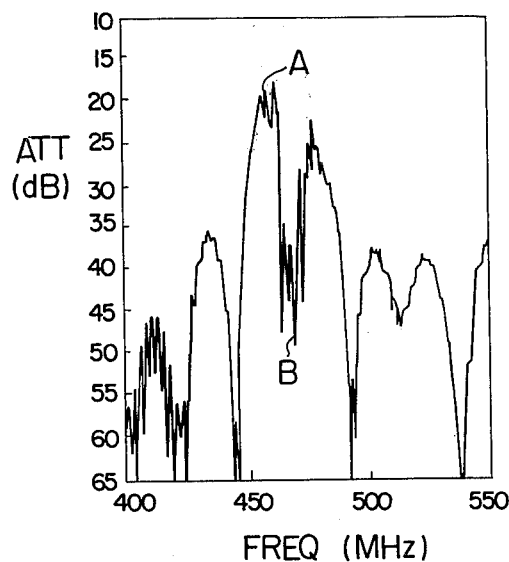
FIG. 4
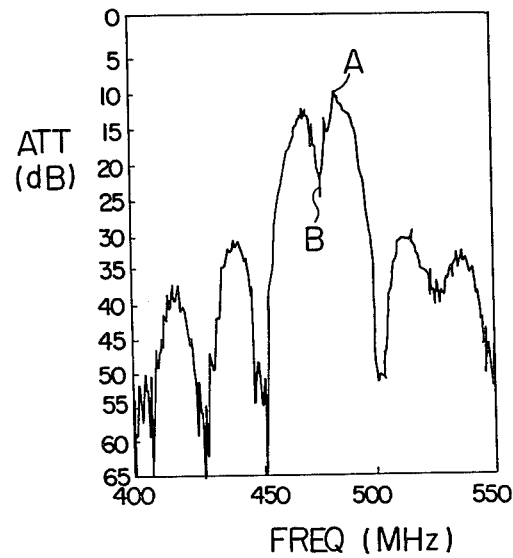
FIG. 5

SURFACE ACOUSTIC WAVE DEVICE AND METHOD FOR MANUFACTURING THE SAME

BACKGROUND OF THE INVENTION

1. Field of the Invention

The present invention relates to a surface acoustic wave device for use in high frequency (UHF band) and a method for manufacturing the same, and more particularly to a technology relating to improvements of an overall characteristic and a cost reduction of the surface acoustic wave device.

2. Description of the Prior Art

In recent years, the surface acoustic wave device has been widely used in regions of IF band and VHF band such as in an intermediate frequency filter for a television receiver of 50 MHz-60 MHz band. In a high frequency surface acoustic wave device for use in UHF band, a width of electrode fingers of input and output interdigital electrodes (electrode fingers of metal film grating type reflector) is no more than 2 $\mu$m and a thickness of the film is less than 0.25 $\mu$m. The film is usually made of Al thin film. While a few technical reports which disclose specific numerical data have been known, some of them disclose relatively large values of film thickness. For example, manufacturing methods using wet chemical etching are reported in the Technical Report of the Institute of Electronics and Communication Engineers of Japan, 77 (171), 1977 and Journal of Association of Acoustic of Japan, 33 (10), October 1977, methods using lift-off technique are reported in 1977 Ultrasonic Symposium Proceedings, pages 792-797 and J. Electrochemical Society, 121 (11), pages 1503-1506. In those reports, the thickness of the Al film of the electrode finger is no more than 0.2 $\mu$m.

In the prior art surface acoustic wave device for use in the high frequency band, the width of the electrode finger is no more than 2 $\mu$m and the film thickness of the narrow electrode finger is no more than 0.2 $\mu$m as described above mainly because of a subsidiary acoustic effect encountered when the thickness of the Al film is thicker than the above thickness, for example large dispersion of effective surface acoustic wave velocity of the interdigital electrode and large reflection between and in the input and output electrodes. Those facts caused the designers and the researchers of the surface acoustic wave device to have a feeling of risk of reduction of design margin of characteristics when the film thickness is increased.

At least two secondary adverse effects have been reported which usually occur in the characteristics when the film thickness of the electrode finger is increased. The first effect is the increase of dispersion of effective surface acoustic wave velocity at the electrode fingers of the interdigital electrode. (1974 Ultrasonics Symposium Proceedings, pages 321-328). As an experimental example, the Technical Report of the Institute of Electronics and Communication Engineers of Japan, 75 (252), pages 25-32, 1975 and 1976 Ultrasonics Symposium Proceedings, pages 432-435 show that the dispersion increases as the film thickness increases. The other effect is that the reflection of the grating type reflector of the metal film increases but the reflection of the electrode fingers of the input and output interdigital electrodes also increases, and disturbance of band characteristic and ripple due to triple transit echo (TTE) are likely to occur.

Accordingly, it is considered that the use of the electrode having the film thickness of no more than 0.2 $\mu$m has been mandatory in designing the device.

The second reason for limiting the thickness of the Al film to no more than 0.2 $\mu$m for the electrode fingers having the width of no more than 2 $\mu$m is considered to be due to the difficulty in the manufacture as explained below. In a conventional chemical etching process frequently used in the past, the etching proceeds not only normally to the Al film surface but also laterally of the Al film (as reported in Handbook of Thin Film Technology, pages 7-45, Maissel and Glang, 1970) and a large undercut takes place because the etching solution penetrates into a boundary surface of a photoresist and the Al film. For example, the Technical Report of The Institute of Electronics and Communication Engineers of Japan, 77 (259), pages 9-16, March 1978 reports that when the line width of the electrode was 0.58 $\mu$m and 0.7 $\mu$m, the line width was reduced by 0.2 $\mu$m even when the film thickness was no more than 0.043 $\mu$m. In the lift-off process, a thin Al film must be used in order to facilitate the removal of resist and at the same time a temperature of a piezoelectric substrate must be maintained at a low temperature during deposition of the Al film. Under those conditions, in order to enhance the adhesability of the Al film to the substrate, Cr or Ti must be previously vapor-deposited. This requires additional steps and cost. An ion etching process by ion shower is advantageous for fine etching but since it is a physical etching process by ion bombardment a selection between the photoresist and the Al film is low and the Al film thickness is restricted and the surface of the substrate is significantly damaged. (Journal of Association of Electronics and Communication Engineering of Japan, 60 (11), page 1259, November 1977). Accordingly, the film thickness of approximately 0.2 $\mu$m has been necessarily considered as a barrier.

In addition to the above design problems and the manufacturing process problems, the following problems are encountered in the high frequency surface acoustic wave device which is used in a higher frequency and has an electrode finger width of no more than 2 $\mu$m and a film thickness of less than 0.25 $\mu$m. (1) Because of very thin film thickness, defect such as break of the electrode finger due to pinholes is likely to occur and a yield is low. (2) Because of large resistance of the electrode fingers of the input and output interdigital electrodes, a loss is high. (For example, 31st Annual Frequency Control Symposium Proceeding, pages 281-284, reports that the loss of 16-17 dB at the thickness of 0.16 $\mu$m increased to 19-20 dB at the thickness of 0.1 $\mu$m). (3) When an Al film grating type resonator is used, the number of grating electrodes increases significantly (200-300 electrodes) and a chip area increases accordingly. This leads to the further reduction of yield due to the pinholes. As an example in a VHF band, The Journal of the Institute of Electronics and Communication Engineers of Japan, Vol. 1, J 60-A (9), pages 875-876, September 1977, reports that more than 200 parallel-connected Al electrodes each having a thickness of 0.37 mm must be arranged on a LiNbO$_3$ substrate in order to attain a reflection efficiency of no less than 0.9 at 160 MHz, and more than 300 parallel-connected Al electrodes each having a thickness of 0.48 $\mu$m must be arranged on a quartz substrate to attain the same reflection efficiency. This means that a substrate length in the direction of propagation of the surface acoustic wave of approximately 2 mm for the LiNbO$_3$ substrate and approximately 3 mm for the quartz substrate is additionally required. If the film thickness is less than 0.25 μm, more number of electrodes are required. If an Al film thinner than the conventional thickness of 0.2 μm is used to form a grating type reflector having a reflection factor of no less than 0.9 at 500 MHz, a length of no less than 1 mm is required. When an electrode of Au 0.2 μm/Cr 0.05 μm was used, a 50-line grating type reflector presented approximately 20 dB of attenuation at 170 MHz, but since the Au electrode has a large mass, it has a very large dispersion of surface acoustic wave velocity and hence it is not appropriate to use when the high frequency input and output interdigital electrodes and wide band elements coexist on a common substrate. (4) In a device in which not only the UHF band input and output electrodes and grating type reflector but also the VHF band input and output electrodes (no higher than 300 MHz) and grating type reflector are to be formed on a common substrate, if an Al film thinner than the conventional thickness of no more than 0.2 μm is used, the number of electrodes of the VHF band grating type reflector increases as seen from the previous example and hence the area of the substrate increases. Contrarily, if the film thickness of the VHF band devices is increased in order to reduce the number of electrodes of the VHF band grating type reflector, the steps of Al film deposition and photoresist application increase. This eventually increases the cost in view of yield, substrate area and the number of steps. (5) It is difficult to maintain bonding with the Au wires in a stable state for a long time period. To resolve the problem, the thickness of only that portion of the Al film to which the Au wire is wire-bonded may be locally increased but this increases the number of steps. By bonding Al wire instead of Au wire by an ultrasonic bonding method, long life bonding may be attained but this method has lower workability than the Au wire bonding method and makes automation and mass production difficult.

As described above, the prior art high frequency band surface acoustic wave devices have many problems and are expensive. This has made the application of the devices to commercial equipments difficult.

SUMMARY OF THE INVENTION

It is an object of the present invention to provide a high frequency (UHF) band surface acoustic wave device which has less defect such as break of electrode fingers due to pinholes, a low electrode finger resistance, a low loss and a good characteristic.

It is another object of the present invention to provide a high frequency band surface acoustic wave device which facilitates the Au wire bonding work and assures long life of the bonding area.

It is a further object of the present invention to provide a high frequency band surface acoustic wave device which has a reduced number of electrodes of a grating type reflector when the grating type reflector having Au film is used.

It is a still further object of the present invention to provide a method for manufacturing the high frequency band surface acoustic wave device described above.

In order to attain the above objects, in accordance with the surface acoustic wave device of the present invention, when high frequency band metal strips having a width of no more than about 2 μm are used in functional elements such as input and output interdigital electrodes of metal strips and a grating type reflector arranged on a piezoelectric substrate and a portion or all of other wiring electrodes arranged on the same substrate, at least the metal strips having the width of no more than about 2 μm have the film thickness of no less than about 0.25 μm at at least a portion thereof or at any portions thereof but no more than an upper limit of an effective film thickness determined by the characteristics required for the surface acoustic wave device so that a reflection factor of the grating type reflector for compensating and controlling a transfer characteristic of the surface acoustic wave device is increased and a loss due to a D.C. resistance of the input and output electrodes is reduced.

The term functional elements herein used means components responsible to elementary functions for carrying out overall function of the surface acoustic wave device, such as interdigital electrodes, grating electrodes, absorbers, bonding pads, common buses and conductors.

The manufacturing method of the surface acoustic wave device is characterized by heating the piezoelectric substrate to a temperature of no lower than about 250° C., forming the Al film having the film thickness of no less than about 0.25 μm and forming a desired pattern of electrodes by a reactive sputter etching process. The manufacturing method of the surface acoustic wave device is further characterized by carrying out the reactive sputter etching process under a condition of the provision of means for assuring uniform concentration of vapor phase compound which contributes to the reaction near the surface of the piezoelectric substrate and compensating for flux concentration effect and field distribution due to high dielectricity of the piezoelectric substrate.

BRIEF DESCRIPTION OF THE DRAWINGS

FIG. 1 is a plan view showing a surface acoustic wave device to which the present invention is applicable.

FIG. 2 shows a sectional view taken along a line I—I shown in FIG. 1.

FIG. 3 shows a sectional view taken along a line II—II shown in FIG. 1.

FIG. 4 shows a chart of a frequency characteristic measured for a first embodiment which uses a LiNbO₃ substrate.

FIG. 5 shows a chart of a frequency characteristic measured for a comparative conventional surface acoustic wave device.

DESCRIPTION OF THE PREFERRED EMBODIMENTS

Figure 6:
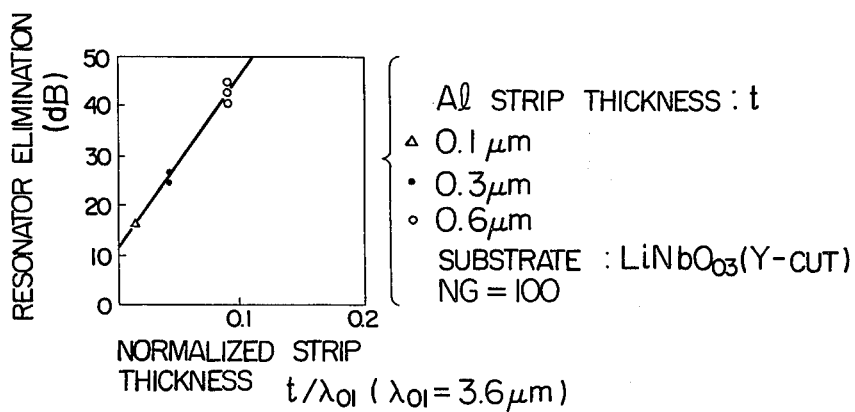
FIG. 6 shows a chart illustrating a relationship between a film thickness of the surface acoustic wave device using the LiNbO₃ substrate and an attenuation of a reflector.

Referring to the accompanying drawings, the preferred embodiments of the present invention will now be explained in detail. In the illustrated embodiments, the functional elements comprise input and output interdigital electrodes and a grating type reflector. FIG. 1 shows a plan view of a surface acoustic wave device to which the present invention is applied, FIG. 2 shows a sectional view taken along a line I—I shown in FIG. 1 and FIG. 3 shows a sectional view taken along a line II—II shown in FIG. 1. In those figures, portions 1a, 1b, 1c, 1d, 1e, 1f, 1g and 2a, 2b, 2f, 2g form a UHF-band filter 1 and portions 3a, 3b, 3c, 3e, 3f, 3g and 2a, 2b, 2f, 2g form a UHF-band filter 2. The portions 1a and 3a are input bonding pads of those filters, the portions 1b and 3b are r.f. bus conductors, and the portions 1c and 3c are interdigital electrodes. The portion 2a is a common grounding input bonding pad and a portion 2b is an input bus conductor for grounding the interdigital electrodes 1c and 3c. The portion 1d is a grating type reflector of the UHF-band filter 1 having a number of electrodes shorted at opposite ends. The portions 1e and 3e are output interdigital electrodes of the filters and the portions 1f and 3f are output r.f. bus conductors of the filters which are connected to the external through the output bonding pads 1g and 3g, respectively. The portion 2f is a common grounding output bus conductor for connecting the output interdigital electrodes 1e and 3e to the bonding pad 2g.

The operation of the filters 1 and 2 is now briefly explained.

An input electrical signal to the UHF-band filter 1 is applied to the interdigital electrode 1c through the bonding pad 1a and the bus conductor 1b. The electrical signal applied to the interdigital electrode 1c is transduced to a surface acoustic wave, which propagates rightward as viewed in FIG. 1. When it passes through the grating type reflector 1d, portions of frequency components are attenuated and the surface acoustic wave reaches the output interdigital electrode 1e. The surface acoustic wave having reached the output interdigital electrode 1e is transduced to an electrical signal, which is picked up as an output electrical signal through the bus conductor 1f and the bonding pad 1g. The same operation is carried out in the UHF-band filter 2 except that no absorption by the grating type electrode takes place.

An electrode wavelength of the UHF-band filter 1 is $\lambda_{01}$ as shown in FIG. 2 and $N_1$ r.f. bus conductors 1b and 1f and $N_1$ interdigital electrodes 1c and 1e are arranged at an interval of $\lambda_{01}/2$ a length $a_1$ represents a width of the respective electrode. A width of the respective electrode of the grating type reflector is $a_G$ and $N_G$ electrodes are arranged at an interval of an electrode wavelength $\lambda_{0G}$. An electrode wavelength of the UHF-band filter 2 is $\lambda_{02}$ as shown in FIG. 3 and the electrodes are arranged in $N_2$-electrode groups at an interval of the electrode wavelength $\lambda_{02}$.

In FIGS. 2 and 3, t represents a thickness of the metal films of the respective electrodes, which are formed on a piezoelectric substrate 4 by forming metal films, more particularly well-known Al films.

In a first embodiment of the present invention, a high frequency band surface acoustic wave device comprises the piezoelectric substrate 4 of Y-axis cut LiNbO₃ single crystal with a direction of propagation of surface acoustic wave device being in line with a Z-axis (or a direction of polarization of the piezo-electric substrate).

The data for the variables shown in FIGS. 1, 2 and 3 in the present embodiment are as follows. The electrode wavelength $\lambda_{01}$ is 7.2 μm, $\lambda_{02}$ is 5.6 μm, $\lambda_{0G}$ is 7.2 μm, the electrode width $a_1$ is 1.8 μm, $a_2$ is 1.4 μm and $a_G$ is 1.8 μm. The number $N_1$ of electrodes is 20, $N_2$ is 20 and $N_G$ is 100. The electrode thickness t is 0.6 μm.

Figure 7:
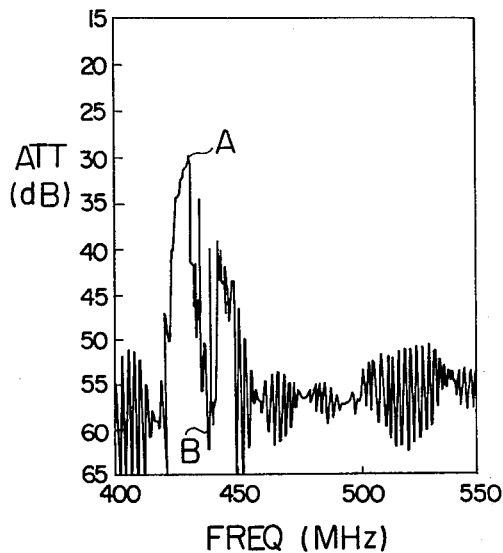
FIG. 7 shows a chart of a frequency characteristic measured for a second embodiment which uses a LiTaO₃ substrate.
Figure 8:
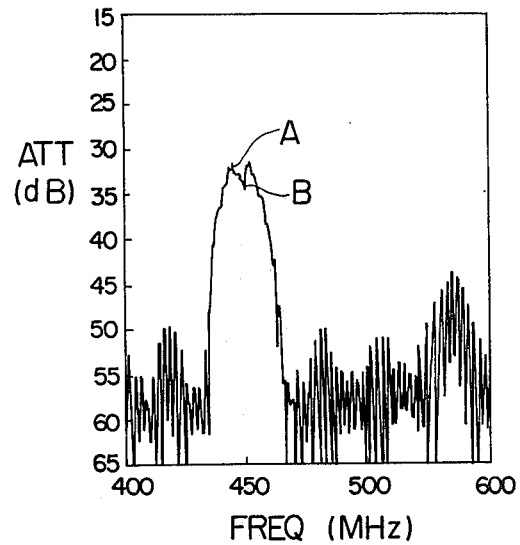
FIG. 8 shows a chart of a frequency characteristic measured for a comparative conventional surface acoustic wave device.

An attenuation characteristic of an electrical signal between the input and output terminals measured for the present embodiment is shown in FIG. 4, in which a point A represents a peak in a pass band characteristic of the UHF-band filter 1 and a point B represents a peak in a band elimination resonance characteristic of the grating type reflector 1d which is shown in superposition on the pass band characteristic. (A's and B's in FIGS. 5, 7 and 8 represent the similar peaks).

While the attenuation characteristic includes some ripples, a desired characteristic is attained. Particularly, a band elimination resonance characteristic of 30 dB (A-B) is attained at a center of the band of the UHF-band filter 1 (in the vicinity of 475 MHz). It is seen from the data shown in FIG. 4 that the effect to the characteristic when the film thickness of the electrode fingers increases is practically permissible. This will be discussed further hereinlater. The band elimination resonance characteristic of 30 dB at the center of the band of the UHF-band filter 1 is due to the grating type reflector 1d. In spite of the fact that the number $N_G$ of electrodes of the grating type reflector is only 100, a good band elimination characteristic is attained. This indicates the possibility of reduction of the substrate area. Because the electrode thickness is large, the break due to pinholes does not take place and hence the manufacturing yield is improved, and the loss is reduced since the electrode resistance is reduced.

In comparison to the improvement in the characteristic of the surface acoustic wave device in accordance with the present invention, FIG. 5 shows an attenuation frequency characteristic of a UHF-band filter formed by a conventional chemical etching process using the same plan structure as that of the previous embodiment except that the film thickness is changed to 0.1 μm. The attenuation (A-B) at a center of the band of the UHF-band filter 1 (in the vicinity of 475 MHz) is 16 dB in FIG. 5. Accordingly, there is a difference of attenuation of no less than 14 dB from the attenuation attained in the embodiment of the present invention. This clearly shows an advantage of the present invention.

Ripples included in the attenuation characteristic are due to a triple transit echo (TTE) and they can be reduced by using split type of input and output interdigital electrodes. They can also be reduced by reducing the number $N_1$ of electrodes of the input and output interdigital electrodes to approximately 10 (or 5 electrode pairs). Technically, it is not an essential problem.

In order to discuss the applicability and the limit of the present invention, the attenuation of the grating type resonator with variable film thickness of the electrode fingers is shown below. Relationships between ratios of actual film thickness to wavelength of the surface acoustic wave or normalized film thickness $t/\lambda_{01}$ and the resonator elimination for the representative data showing the entire trends of the experiments, that is, the Al film thicknesses t of 0.1 μm, 0.3 μm and 0.6 μm, respectively, are shown in FIG. 6. They are substantially linear as shown. It is seen from FIG. 6 that the film thickness of no less than about 0.25 μm may be used in order to attain the resonator attenuation of no less than about 20 dB. This is the first reason for selecting the lower limit of the film thickness of the surface acoustic wave device having the LiNbO$_3$ substrate to about 0.25 μm.

In a second embodiment of the present invention, the piezoelectric substrate is made of a Y-cut LiTaO$_3$ single crystal with a direction of propagation of the surface acoustic wave being in line with Y-axis. The plan structure and the plan dimensions of the electrodes are identical to those of the first embodiment with the exception that the thickness of the Al electrodes is 0.6 μm. An attenuation frequency characteristic of the second embodiment is shown in FIG. 7. The attenuation (A-B) is 32 dB, which is sufficient for practical use. FIG. 8 shows an attenuation frequency characteristic of a conventional surface acoustic wave device having the same structure as FIG. 7 with the exception that the Al film thickness is changed to 0.1 μm. The attenuation (A-B) of the resonator at the center of the band (in the vicinity of 450 MHz) is only 4 dB in FIG. 8. This indicates that the second embodiment of the present invention presents a significant effect of a high degree of elimination in the grating type reflector, and further reduction of the number N$_G$ of electrodes of the grating type reflector 1d is possible if the attenuation required is as low as about 20 dB. As a result, the substrate area can be further reduced. This is advantageous from the viewpoints of both yield and cost. The same effects as attained in the first embodiment are also presented.

Figure 9:
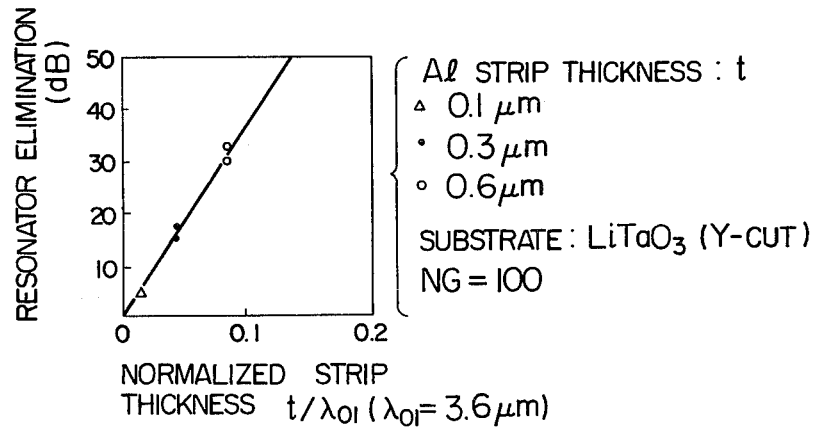
FIG. 9 shows a chart illustrating a relationship between a film thickness of the LiTaO₃ substrate and an attenuation of a reflector.

In order to evaluate the applicability and the limit of the present invention which uses the LiTaO$_3$ substrate, relationships between the normalized film thicknesses $t/\lambda_{01}$ and the attenuations of the resonators similar to those shown in FIG. 6 are shown in FIG. 9 for the samples having the same plan structure and plan dimensions as those of the second embodiment with variable Al film thickness of the electrode fingers. It is seen from FIG. 9 that the Al film thickness t of approximately 0.3 μm may be used in order to attain the resonator attenuation of 20 dB. When the Al film thickness is 0.25 μm, the attenuation is approximately 10 dB, but the attenuation of approximately 20 dB may be attained by increasing the number N$_G$ of electrodes of the grating type reflector to approximately 200. In the conventional sample having the Al film thickness of 0.1 μm, the attenuation is approximately 4 dB. Accordingly, approximately 500 grating electrodes are required to attain the attenuation of 20 dB. It is thus seen that a significant advantage is presented even when the Al film thickness is about 0.25 μm.

The experimental proofs which show that the technical concept of the present invention is superior to the prior art technical concept have been described so far. The advantages of the present invention are more clearly exemplified in the following third embodiment in which low frequency surface acoustic wave devices and high frequency surface acoustic wave devices coexist on a common substrate. Although not specifically shown, it should be readily understood from the following description that when a predetermined amount (e.g. 20 dB) of attenuation is to be attained in the grating type resonator, the number of grating electrodes increases materially for the low frequency devices if the film thickness is small (e.g. 0.1 μm) as is the conventional one, and hence a large substrate area is required. On the other hand, according to the present invention, since the film thickness is large, the number of grating electrodes for the low frequency device may be very small and hence a substrate area may also be small. Various advantages result from the above.

An experimental data which implies a possibility of the technical concept of the present invention of using the thick film while the thin metal film has been used for the prior art electrode fingers is briefly shown below.

Figure 10:
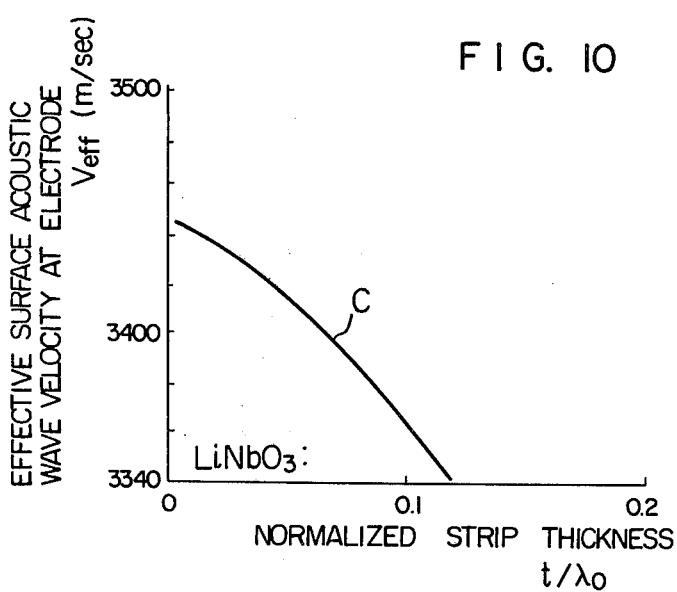
FIGS. 10 and 11 show charts illustrating relationships between the film thicknesses of the LiNbO₃ substrate and the LiTaO₃ substrate, respectively, and effective surface acoustic wave velocities at the electrodes.
Figure 11:
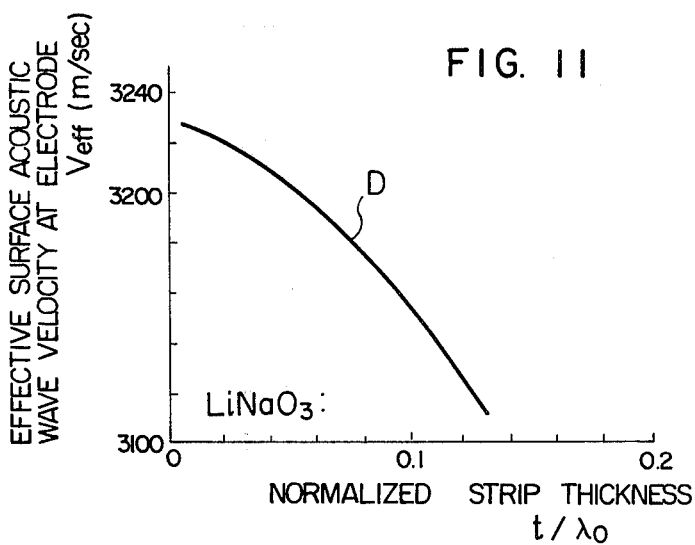

What was considered most important and risky with respect to the transfer characteristic of the surface acoustic wave device is the increase of dispersion of effective surface acoustic wave velocity at the electrodes due to large thickness of the film of the interdigital electrodes. In order to review the prior technical concept, the inventors of the present invention experimentally discussed the above phenomenon and obtained experimental data as shown in FIG. 10 for the Y-cut LiNbO$_3$ single crystal substrate and as shown in FIG. 11 for the Y-cut LiTaO$_3$ single crystal substrate, both having the Al thin film electrodes. In FIGS. 10 and 11, the abscissa represents the normalized film thickness and the ordinate represents the effective surface acoustic wave velocity at the electrode. Both the curves C and D show the same trend although the absolute values are different. When the Al film thickness is 0.6 μm, the variation of the 500 MHz filter frequency and the resonator frequency is approximately 0.6 MHz for the film thickness variation of ±5%. If a low temperature coefficient LiTaO$_3$ is used with a care being paid for the uniformity of the film thickness, it is practically acceptable. By improving grinding level, the dispersion of the effective surface acoustic wave velocity at the electrodes is reduced so that the Al film having the film thickness of approximately 0.6 μm is practically accepted without strict requirement for the uniformity of the film thickness so long as the film thickness is maintained within an industrial limit of uniformity. However, too thick film should be avoided because it results in the substantial increase of frequency variations (increase of gradient) due to the dispersion of the surface acoustic wave velocity and the differences (by the factor of two or three) in the resolution of the resist and the etching rates of the reactive sputter etching for the Al film and the resist. In a current technology, the limit will be approximately 1.5 μm. When the electrode finger width is 1.0 μm and the height is 1.5 μm, the electrode finger having a height-to-width ratio of no less than unit, which has not been attained heretofore, is attained.

While the interdigital electrodes have been described so far, the present invention is also applicable to a so-called comb-shape characteristic filter in which two electrodes of the same geometry are arranged in an output circuit and a number of pass band peaks are provided at a frequency interval equal to a reciprocal of a difference of delay time between those electrodes. When the operating band is wide and well defined, a desired characteristic can be attained in combination with the grating type reflector without increasing the substrate area. In any case of the above, the surface acoustic wave device of the present invention has the Al film thickness of no less than about 0.25 μm for the high frequency device so that the defect of break of the electrode fingers due to the pinholes is eliminated and the electric resistance is low and hence the resistance loss of the electrodes is low and the yield is improved. Further, the bonding of the Au wires can be readily and stably carried out and the bonded connections have long life. In addition, where the grating type resonator is included, the number of electrodes can be reduced. The Al film may be substituted by Al-Si or Al-Cu-Si alloy film.

A manufacturing method of the surface acoustic wave device according to the present invention is now explained. When a surface acoustic wave device in which the low frequency devices and the high frequency devices coexist is manufactured by a prior art technique, it is necessary in order to prevent the increase of the number of grating type reflector of the low frequency devices to vapor-deposit thin metal film on the high frequency devices and then thicken the metal film of the electrodes of the low frequency devices. As a result, separate vapor deposition steps and photo-etching processes are required. This leads to the increase of the number of steps, the reduction of yield and the increase of cost. When a chemical etching process by conventional chemical solution is used, it is difficult to manufacture the electrode having a narrow line width and a thickness of no less than about 0.25 $\mu$m, as explained above. When the conventional reactive sputter etching process is used, the Al film is peeled off at its narrow portion when pure water is sprayed under a high pressure immediately after the etching process or in a subsequent dicing process, or during an ultrasonic cleaning step, and hence a satisfactory product has not been produced. The manufacturing method of the present invention is intended to overcome the above difficulties. Firstly, since the film thickness of the high frequency devices is large (no less than about 0.25 $\mu$m), the high frequency and low frequency devices can be vapor deposited in one step and the subsequent photo-etching process is also completed in one step.

Figure 12:
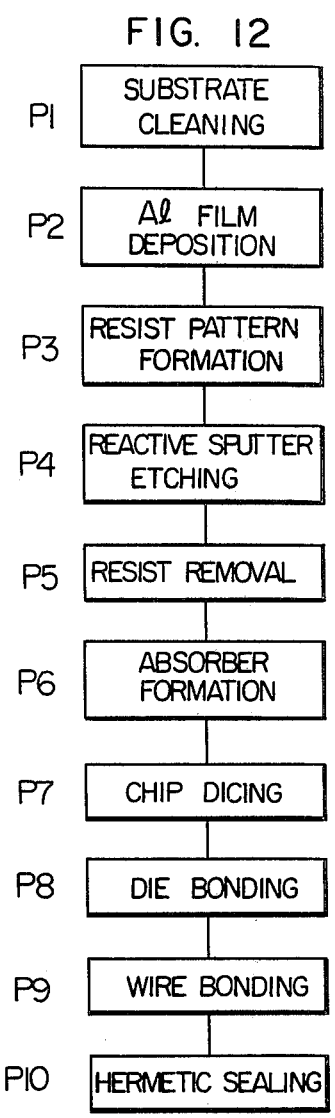
FIG. 12 shows a flow chart of steps illustrating a manufacturing method of the present invention.

FIG. 12 shows a flow chart of steps in one embodiment of the manufacturing method of the present invention. The LiNbO$_3$ (or ITaO$_3$) substrate is cleaned (P$_1$). The substrate is then heated to about 300°-350° C. and Al (or Al-Si alloy or Al-Cu-Si alloy) is deposited at a deposition rate of about 100-150 Å/sec to the film thickness of no less than about 0.25 $\mu$m (P$_2$). A resist pattern of a desired electrode shape and dimension is formed (P$_3$) and vapor phase etching is carried out in low pressure reactive glow discharge, using BCl$_3$ as a reactive gas with a flow rate of 30-100 SccM (standard cc/min: N$_2$ equivalent flow rate) at a pressure of 0.1-0.3 Torr and an electric power of 150-300 watts while monitoring discharge emission by a spectrometer (P$_4$). The reactive gas may be CCl$_4$ or BCl$_3$ with some additives. The substrate is then taken out and washed in a weak alkaline solution, then in water, and the photoresist is peeled off (P$_5$). Sound absorbing material is applied to areas corresponding to ends of chips (P$_6$). After the material has been cured, the substrate is diced by a wheel saw to divide it into chips (P$_7$). The chips are die-bonded to a TO-8 package stem by conductive epoxy resin (P$_8$). After it has been cured, ultrasonic/hot press wire bonding is carried out at a relatively low temperature by an Au wire having a diameter of 25-30 $\mu$m (P$_9$). Caps are welded in a dry nitrogen atmosphere (P$_{10}$). The surface acoustic wave device chips manufactured by the above process have satisfactory performance except those chips which are located at periphery of the wafer.

Figure 13:
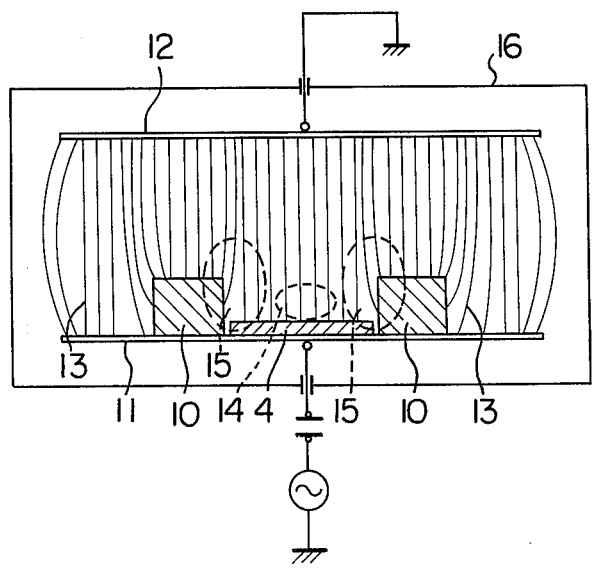
FIG. 13 shows a schematic sectional view of a reactive sputter etching device which is a manufacturing device in accordance with the present invention.

A first important aspect in the manufacturing method described above is that in the deposition step P$_2$ it is preferable to deposit Al film at the substrate temperature of about 300°-350° C. in order to enhance the adhesion of the deposited Al film to the substrate, though the high frequency surface acoustic wave devices can be manufactured at a substrate temperature of no lower than about 250° C. (deposition rate being about 50 Å/sec or lower). A second important aspect is that in the reactive sputter etching step P$_4$ an SiO$_2$ ring 10 (see FIG. 13) having a larger rectangular sectional area then the thickness of the substrate and a larger inner diameter than the diameter of the substrate 4 is mounted on a first electrode 11 connected to an r.f. power supply, and the substrate is mounted on the first electrode in the ring 10.

Preferable range of the thickness of the SiO$_2$ ring is 1 mm to 7 mm (about 3 to 30 times as thick as the substrate thickness) for the substrate thickness of 0.3-0.5 mm. When the piezoelectric substrate has a high dielectric constant, a relatively thick ring e.g. 4-6 mm thick is preferable from a viewpoint of uniformity.

The use of the SiO$_2$ ring resolves the problem of peel-off of the thick Al film at its narrow area in the periphery of the substrate.

The inventors of the present invention found that the problem encountered at the periphery of the substrate is due to the fact that the etching rate of the reactive sputtering of the Al film on the piezoelectric substrate is faster in the periphery of the substrate than in the center of the substrate by the factor of 1.5-2. Through the discussion of the above phenomenon in detail, it has been found that (i) without the ring 10, the reaction product near the substrate surface is apt to be diffused so that the concentration in a space 15 near the periphery of the substrate is lower than the concentration in a space 14 near the center of the substrate and the etching rate in the periphery of the substrate is higher than the etching rate in the center of the substrate, and (ii) the dielectric constant of the LiNbO$_3$ or LiTaO$_3$ piezoelectric substrate used for the surface acoustic wave device is large (specific dielectric constant being 40-50) and hence the dielectic fluxes 13 concentrate to the substrate. Since a peculiar point exists in the periphery of the substrate, flux density is high at the periphery and the ions induced by the reactive sputter etching concentrate to other areas so that the etching rate is increased. In the reactive sputter etching process for the Al electrode on the piezoelectric substrate having the fine line width (no more than about 2 $\mu$m) and the thickness of no less than about 0.25 $\mu$m, it is particularly important to correct ununiform distribution of the etching rate due to the facts (i) and (ii) above. After extensive study, the inventors of the present invention found that the use of SiO$_2$ ring having a characteristic thickness is advantageous. By the use of the SiO$_2$ ring of the selected thickness, the concentration of the reaction product in the space 15 near the periphery of the substrate increases to a level comparative to the concentration in the space 14 near the center of the substrate and the fluxes otherwise concentrated to the periphery of the substrate are attracted to the corners of the SiO$_2$ ring which is thicker than the substrate so that the density the fluxes at the periphery of the substrate is lowered to a level of the density of the fluxes at the center. In this manner, the flux distribution is averaged. Because the piezoelectric substrate having a high dielectric constant is used, the thick SiO$_2$ ring is required to compensate for the concentration of the fluxes. The intended object was not attained by an SiO$_2$ ring almost as thick as a Si substrate.

In accordance with technical concept for resolving the above problems, a SiO$_2$ plate having a recess at an area in which the piezoelectric substrate is mounted, which recess has a flat bottom and a larger depth than the thickness of the substrate, may be used instead of the SiO$_2$ ring used in the previous embodiment to cover the entire surface of the discharging electrode of the reactive sputter etching equipment. The depth of the recess is preferably equal to the thickness of the SiO$_2$ ring.

In the embodiment described above, the surface acoustic wave device having a minimal line width and spacing of 0.7 μm was manufactured with ordinary ultraviolet ray lithography. When electron beam exposure or X-ray exposure is adopted in the lithography, it is possible to manufacture the surface acoustic wave device having the electrode width of 0.1 μm and hence the device is more adapted for use in high frequency band. It is apparent that the surface acoustic wave device can be manufactured in more stable manner when the manufacturing method of the present invention is applied to the manufacture of the surface acoustic wave device having a thin Al film and the surface acoustic wave device having a large line width.

As described hereinabove, according to the surface acoustic wave device and the manufacturing method thereof of the present invention, products having high performance high frequency devices and/or low frequency devices are provided and the step of locally thickening for the Au bonding is not required and the break due to the pinholes does not take place. As a result, the mass-productivity and the yield are improved.

It also provides the advantages of the reduction of the number of steps, the simplification of a test process and the availability of the monitor check in the reactive sputter etching process. Thus, the contribution of the present invention to the industry is great.

We claim:

1. Method for manufacturing a surface acoustic wave device comprising the steps of:
   heating a piezoelectric substrate to a temperature of no lower than about 250° C.;
   forming a metal thin film having a film thickness of no less than about 0.25 μm for forming a functional element; and
   patterning said metal thin film by a reactive sputter etching process using a resist film to the reactive sputter etching, said reactive sputter etching being performed in the presence of means for averaging a concentration of vapor phase compound contributing to major reactions in the vicinity of the surface of said substrate and correcting an electric field distribution, said means including an SiO$_2$ member having a hole with larger dimensions than the substrate such that the substrate is positioned in the hole.

2. Method for manufacturing a surface acoustic wave device comprising the steps of:
   heating a piezoelectric substrate to a temperature of no lower than about 250° C.;
   forming a metal thin film having a film thickness of no less than about 0.25 μm for forming a functional element; and
   patterning said metal thin film by a reactive sputter etching process using a resist film to the reactive sputter etching under a condition of the provision of means for averaging a concentration of vapor phase compound contributing to major reactions in the vicinity of the surface of said substrate and correcting an electric field distribution, wherein said means for averaging the concentration of the vapor phase compound contributing to the reactions and correcting the electric field distribution includes a ring made of a dielectric material having a height preselected to said piezoelectric substrate.

3. Method for manufacturing a surface acoustic wave device comprising the steps of:
   heating a piezoelectric substrate to a temperature of no lower than about 250° C.;
   forming a metal thin film having a film thickness of no less than about 0.25 μm for forming a functional element; and
   patterning said metal thin film by a reactive sputter etching process using a resist film to the reactive sputter etching under a condition of the provision of means for averaging a concentration of vapor phase compound contributing to major reactions in the vicinity of the surface of said substrate and correcting an electric field distribution, wherein said means for averaging the concentration of the vapor phase compound contributing to the reactions includes a plate made of a dielectric material having a recess of a predetermined depth to accommodate said piezoelectric substrate therein.

4. Method for manufacturing a surface acoustic wave device according to claim 2 or 3 wherein said dielectric material is made of SiO$_2$.

5. Method for manufacturing a surface acoustic wave device according to claim 2 wherein the height of said dielectric ring is three to thirty times as high as the thickness of said piezoelectric substrate.

6. Method for manufacturing a surface acoustic wave device according to claim 3 wherein the depth of said recess of said dielectric plate is about three to thirty times as deep as the thickness of said piezoelectric substrates.

7. Method for manufacturing a surface acoustic wave device comprising the steps of:
   forming a metal thin film on a piezoelectric substrate;
   forming a resist film having a desired pattern on said metal thin film; and
   forming a functional element by etching said metal thin film by a reactive sputter etching process using said resist film as a mask;
   said sputter etching process including arranging means for correcting concentration distribution of a vapor phase compound and distribution of an electric field, around said piezoelectric substrate having said resist film formed thereon, said means including an SiO$_2$ member having a hole with larger dimensions than the substrate such that the substrate is positioned in the hole to provide said means around said substrate.

8. Method for manufacturing a surface acoustic wave device according to claim 1, 2, 3 or 7, wherein said metal thin film is made of Al, Al-Si alloy or Al-Cu-Si alloy.

9. Method for manufacturing a surface acoustic wave device according to claim 1 or 7, wherein said hole of the SiO$_2$ member has a depth of 1 mm to 7 mm, and the substrate thickness is 0.3–0.5 mm.

* * * * *